(12) United States Patent
Renau et al.

(10) Patent No.: US 6,313,475 B1
(45) Date of Patent: Nov. 6, 2001

(54) ACCELERATION AND ANALYSIS ARCHITECTURE FOR ION IMPLANTER

(75) Inventors: Anthony Renau, West Newbury; Charles McKenna, Boxford, both of MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/625,515

(22) Filed: Jul. 26, 2000

Related U.S. Application Data

(63) Continuation of application No. 09/089,014, filed on Jun. 2, 1998.

(51) Int. Cl.⁷ .................................................. H01J 37/317
(52) U.S. Cl. ............................. 250/492.21; 250/423 R; 250/281; 250/298
(58) Field of Search ........................... 250/492.21, 423 R, 250/281, 282, 283, 298

(56) References Cited

U.S. PATENT DOCUMENTS

| | | | |
|---|---|---|---|
| 5,751,002 | * 5/1998 | Ogata et al. | 250/492.21 |
| 5,945,682 | * 8/1999 | Oh et al. | 250/492.21 |
| 6,130,436 | * 10/2000 | Renau et al. | 250/492.21 |

* cited by examiner

*Primary Examiner*—Bruce Anderson
*Assistant Examiner*—Nikita Wells
(74) *Attorney, Agent, or Firm*—Wolf, Greenfield & Sacks, P.C.

(57) ABSTRACT

An ion beam generator includes an ion beam source for generating an ion beam, an acceleration/deceleration column for selectably accelerating or decelerating ions in the ion beam to desired energies, a source filter positioned between the ion beam source and the acceleration/deceleration column for removing first undesired species from the ion beam, and a mass analyzer positioned downstream of the acceleration/deceleration column for removing second undesired species from the ion beam. The ion beam generator supplies an energetic ion beam having a low level of energy and mass contaminants. The ion beam generator may be utilized in an ion implanter.

16 Claims, 6 Drawing Sheets

ACCELERATION AND ANALYSIS ARCHITECTURE FOR ION IMPLANTER

This application is a continuation of Ser. No. 09/089,014 filed Jun. 2, 1998.

FIELD OF THE INVENTION

This invention relates to systems and methods for ion implantation of semiconductor wafers and, more particularly, to a beamline architecture for generating a high purity energetic ion beam.

BACKGROUND OF THE INVENTION

Ion implantation has become a standard technique for introducing conductivity-altering impurities into semiconductor wafers. A desired impurity materials is ionized in an ion source, the ions are accelerated to form a ion beam of prescribed energy and the ion beam is directed at the surface of the wafer. The energetic ions in the beam penetrate into the bulk of the semiconductor material and are embedded in the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or a combination of beam scanning and target movement. Examples of prior art ion implanters are disclosed in U.S. Pat. No. 4,276,477 issued Jun. 30, 1981 to Enge; U.S. Pat. No. 4,283,631 issued Aug. 11, 1981 to Turner; U.S. Pat. No. 4,899,059 issued Feb. 6, 1990 to Freytsis et al; and U.S. Pat. No. 4,922,106 issued May 1, 1990 to Berrian et al.

A well-known trend in the semiconductor industry is toward smaller, higher speed devices. In particular, both the lateral dimensions and the depths of features in semiconductor devices are decreasing. Device manufacturers need to critically control the depth distribution of implanted dopants. To achieve this, the ion implanter must critically control the energy of ions that impinge on the wafer surface. The requirement for energy control affects many requirements, such as power supply stability. However, the performance of ion implanters has been limited by less obvious causes of energy contamination, which is the presence in the ion beam of particles with energies that differ from the desired implant energy.

Energy contamination can result from interaction between ions in the beam and residual gas molecules in the system. Charge exchange reactions may change the charge state of beam ions when they interact with neutral molecules in the system. As might be expected, the probability of such an exchange occurring depends on the neutral gas density and therefore the system pressure. If, after such a reaction, the beam is accelerated by an electric field, then the ions that have changed charge state will, in the absence of further analysis, reach the target with the incorrect energy. This is because the energy gained by an ion in traversing an accelerating or decelerating electric field is proportional to the charge state of the ion.

The energy range of ion implanter is often extended by tuning the system to transport the multiply charged ions that are produced by the source. In this way, for example, instead of using a 200 KV accelerator to implant 200 keV singly charged ions, 400 keV doubly charged ions can be implanted with suitable tuning. This approach, however, has problems due to the molecular ions that are produced by the source. Consider, for example, that the required ion on target is $P^{++}$. Although the source may be tuned to maximize production of $P^{++}$ ions, it will also generate other ions and in particular generates $P_2^+$ ions. This molecular ion is a well-known source of energy contamination, since it can break up to form $P^+$ ions at almost exactly one-quarter of the energy of the required $P^{++}$ ions. Magnetic analysis can not distinguish between $P^{++}$ ions and $P^+$ ions at one-quarter of the energy, and so ions at lower than required energy reach the target.

Along with ions of the required species, implanters often deposit contaminants onto the wafer surface. The contaminants may be in the form of particles or ions and molecules of another species. The contaminants can be produced by the ion source and transported through the beamline or, alternatively, may be generated by sputtering by energetic ions impinging on surfaces in the beamline.

Accordingly, there is a need for ion implanters wherein the ion beam that is implanted into the semiconductor wafer has low energy contamination and a low content of contaminants.

SUMMARY OF THE INVENTION

According to one aspect of the invention, an ion beam generator is provided. The ion beam generator comprises an ion beam source for generating an ion beam, an acceleration/deceleration column for selectably accelerating or decelerating ions in the ion beam to desired energies, a source filter positioned between the ion beam source and the acceleration/deceleration column for removing first undesired species from the ion beam, and a mass analyzer positioned downstream of the acceleration/deceleration column for removing second undesired species from the ion beam.

The source filter may comprise a first dipole magnet for deflecting desired ion species and a first resolving aperture for passing the desired ion species. The mass analyzer may comprise a second dipole magnet for deflecting the desired ion species and a second resolving aperture for passing the desired ion species. In a preferred embodiment, the first dipole magnet deflects desired ion species by about 25°, and the second dipole magnet deflects desired ion species by about 90°. Preferably, the source filter has relatively low resolution and the mass analyzer has relatively high resolution.

The source filter is preferably located in close proximity to the ion beam source and may be located in a source enclosure with the ion beam source. In a preferred embodiment, the source enclosure comprises a first compartment containing the ion beam source and a second compartment containing the source filter. A passage interconnects the first and second compartments. A first vacuum pump may be coupled to the first compartment and a second vacuum pump may be coupled to the second compartment, so that the first and second compartments are differentially vacuum pumped.

The ion beam source may comprise an ion source for generating ions and an extraction electrode for extracting the ions from the ion source to form the ion beam. An extraction power supply may be coupled between the ion source and the extraction electrode for biasing the extraction electrode negatively with respect to the ion source. For operation in an acceleration mode, an acceleration power supply may be coupled between the extraction electrode and ground for biasing the extraction electrode positively with respect to ground. For operation in a deceleration mode, a deceleration power supply may be coupled between the ion source and ground for biasing the ion source positively with respect to ground.

The acceleration/deceleration column may comprise a terminal electrode, a ground electrode and a focus electrode positioned between the terminal electrode and the ground electrode. A focus voltage is coupled to the focus electrode for focusing the ion beam. The focus voltage may be adjustable.

According to another aspect of the invention, an ion implanter is provided. The ion implanter comprises an ion beam generator for generating a beam of energetic ions, a scanning assembly for deflecting the beam of energetic ions to form a scanned ion beam and an end station for supporting a semiconductor wafer in the path of the scanned ion beam, so that ions in the scanned ion beam are implanted into the semiconductor wafer. The ion beam generator comprises an ion beam source for generating an ion beam, an acceleration/deceleration column for selectably accelerating or decelerating ions in the ion beam to desired energies, a source filter positioned between the ion beam source and the acceleration/deceleration column for removing first undesired species from the ion beam, and a mass analyzer positioned downstream of the acceleration/deceleration column for removing second undesired species from the ion beam.

According to yet another aspect of the invention, a method for generating a beam of energetic ions is provided. The method comprises the steps of generating an ion beam in an ion beam source, removing first undesired species from the ion beam with a source filter to provide a filtered ion beam, selectably accelerating or decelerating ions in the filtered ion beam to provide an ion beam of desired energy, and removing second undesired species from the ion beam in a mass analyzer to provide the energetic ion beam.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
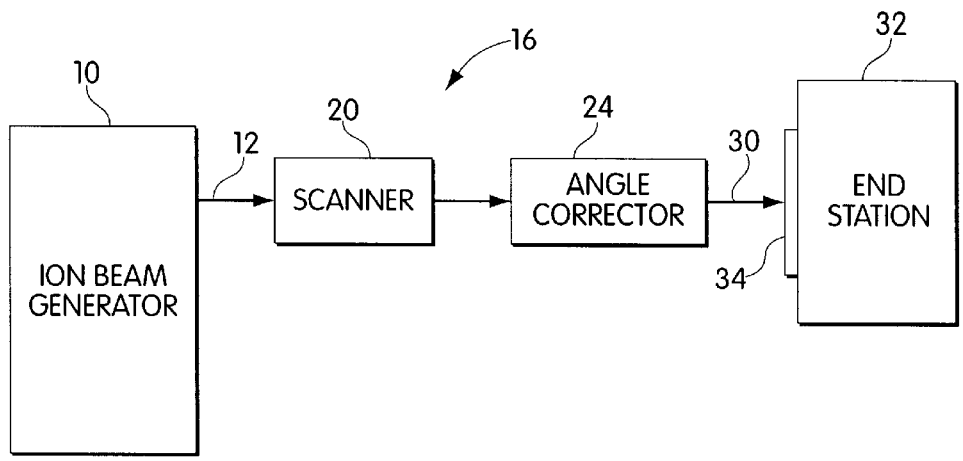
FIG. 1 is a simplified block diagram of an ion implanter in accordance with the invention.

A simplified block diagram of an ion implanter incorporating the present invention is shown in FIG. 1. An ion beam generator 10 generates an ion beam of a desired species, accelerates ions in the ion beam to desired energies, performs mass/energy analysis of the ion beam to remove energy and mass contaminants and supplies an energetic ion beam 12 having a low level of energy and mass contaminants. The ion beam generator 10 is described in detail below. A scanning system 16, which, for example, may include a scanner 20 and an angle corrector 24, deflects the ion beam 12 to produce a scanned ion beam 30. An end station 32 supports a semiconductor wafer 34 or other workpiece in the path of scanned ion beam 30 such that ions of the desired species are implanted into semiconductor wafer 34. The ion implanter may include additional components well known to those skilled in the art. For example, the end station 32 typically includes automated wafer handling equipment for introducing wafers into the ion implanter and for removing wafers after implantation, a dose measuring system, an electron flood gun, etc. It will be understood that the entire path traversed by the ion beam is evacuated during ion implantation.

Figure 2:
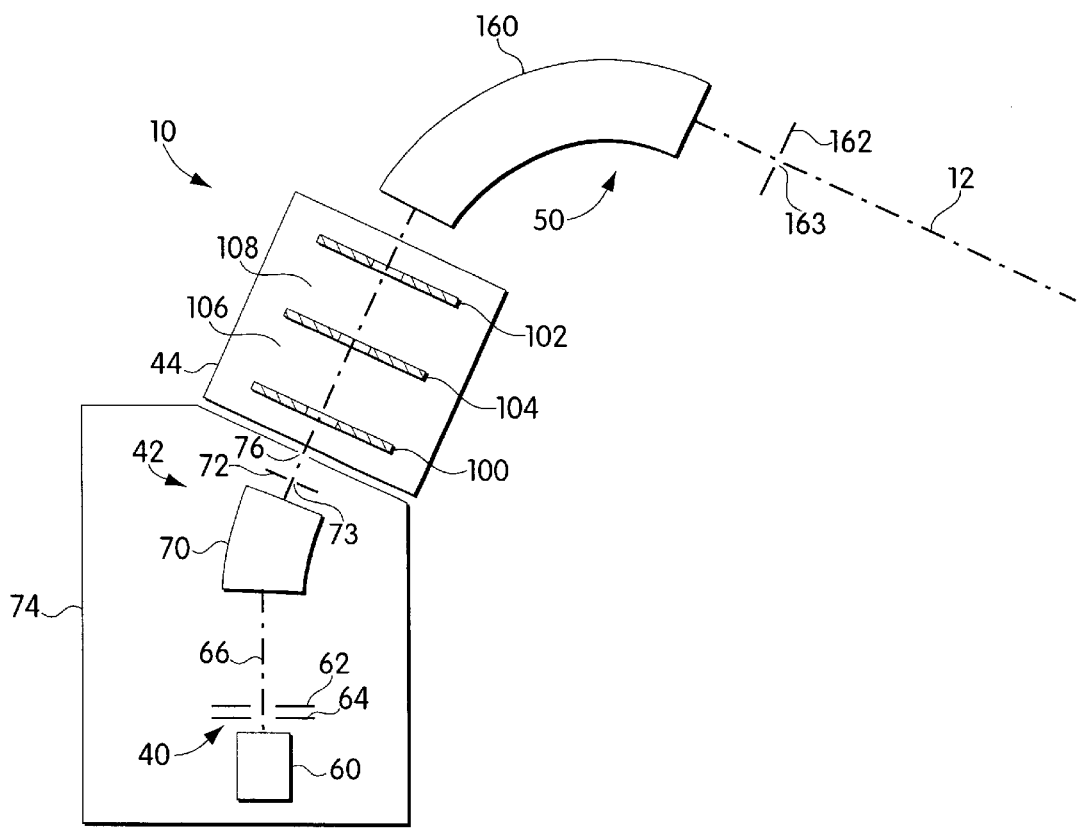
FIG. 2 is a block diagram of the ion beam generator of FIG. 1 in accordance with an embodiment of the invention.

A block diagram of an embodiment of ion beam generator 10 is shown in FIG. 2. The principal components of ion beam generator 10 include an ion beam source 40, a source filter 42, an acceleration/deceleration column 44 and a mass analyzer 50. The source filter 42 is preferably positioned in close proximity to ion beam source 40. The acceleration/deceleration column 44 is positioned between source filter 42 and mass analyzer 50.

Ion beam source 40 includes an ion source 60 and an extraction electrode 62 for extracting an ion beam 66 from ion source 60. Source 40 may include a suppression electrode 64. In an example of ion beam source 40, ions from ion source 60 are accelerated to energies of about 20–80 keV by extraction electrode 62. The construction and operation of ion beam sources are well known to those skilled in the art.

The source filter 42 includes a dipole magnet 70 and a mask 72 having a resolving aperture 73. The source filter 42 is housed in a terminal 74 with the ion beam source 40. The terminal 74 is maintained at the potential of extraction electrode 62. Dipole magnet 70 is a compact ion optical element which deflects the charged particle beam through a desired angle, typically 25°, immediately after extraction from ion beam source 40. A pole gap between the poles of dipole magnet 70 is relatively small, for example about 30 millimeters, thereby reducing the overall size of the magnet. The small pole gap is made possible because the magnet is positioned very close to the ion beam source 40, so that the beam does not expand significantly in size before it enters the dipole magnet 70.

Ions of the desired mass and energy are deflected by dipole magnet 70 so as to pass through the resolving aperture 73. Undesired ions with different masses and energies are deflected by different amounts and are intercepted by mask 72. Thus, the source filter 42 passes desired ions and removes undesired ions. The source filter 42 may be set up to run ions of a desired species by adjusting the current supplied to a magnet coil of dipole magnet 70 so that the desired ions pass through resolving aperture 73. As discussed below, source filter 42 preferably has relatively low resolution.

The dipole magnet 70 does not bring the ion beam to a focus. Instead, it is designed specifically to minimize its impact on the beam envelope and to thereby emulate a simple drift space, except for the 25° deflection of the ion beam. By not bringing the beam to a focus, the power density of the rejected beam at the resolving aperture 73 is greatly reduced. This minimizes the erosion of mask 72, as well as particle generation by erosion and cross contamination by sputtering.

The source filter 42, with its resolving aperture 73 positioned near an exit 76 of terminal 74, is configured to have a relatively low resolving power. Preferably, the source filter 42 has a resolving power, as defined below, in a range of about 2 to 10 and in a preferred embodiment has a resolving power of about 4. With its resolving power of 4, the mass analyzer 42 rejects ions with a normalized rigidity greater than 1.25 or less than 0.75. The resolving power and normalized rigidity are defined below.

In a dipole magnetic field, an ion follows a path determined by its magnetic rigidity ($B_r$) which is equal to its momentum (p) divided by its charge (q). These, in turn, can be related to the ionic mass (m), energy in electron volts (E), charge state (n) and the electronic charge (e).

$$B_r = p/q = \sqrt{2mE/n^2e}$$

(for non-relativistic ions)

The ability of a magnet to prevent ions of undesired rigidity from being transmittd through the associated resolving aperture is characterized by its resolution. Although resolution is often defined in terms of mass or momentum, we shall define resolution in terms of rigidity.

$$\text{Resolving Power} = R_p = \frac{B_{ro}}{(\Delta B_r)_{critical}}$$

where $(\Delta B_r)_{critical}$ is the amount by which the rigidity of an ion has to change before it is not transmitted when the system is set up to run ions with rigidity $B_{ro}$.

This allows us to define a simple criterion to determine if an ion is transmitted by a dipole magnet. If we define the normalized rigidity of an ion as the rigidity of the ion ($B_r$) divided by the rigidity of the required ions ($B_{ro}$).

$$\text{Normalized Rigidity} = B_{norm} = \frac{B_r}{B_{ro}} = \frac{p}{q}\frac{q_o}{p_o} = \frac{n_o}{n}\sqrt{\frac{mE}{m_o E_o}}$$

where the o suffix refers to the required ion, then an ion will be transmitted by the analysis system only if $$|\Delta B_r| \leq |(\Delta B_r)_{critical}|$$

or, more usefully, $$1 - \frac{1}{R_p} \leq B_{norm} \leq 1 + \frac{1}{R_p}$$

In the example of FIG. 2, the acceleration/deceleration column 44 includes a terminal electrode 100, a ground electrode 102 and a focus electrode 104 positioned between electrodes 100 and 102. Terminal electrode 100 and focus electrode 104 are spaced apart by a gap 106; and focus electrode 104 and ground electrode 102 are spaced apart by a gap 108. Electrode 102 is at ground potential, preferably the same voltage as wafer 34 (FIG. 1). Terminal electrode 100 is at the same potential as terminal 74. Focus electrode 104 is at a potential that is established by a focus power supply 132 (FIG. 3).

The acceleration/deceleration column 44 has two principal functions. The first is to accelerate or decelerate the ions in the ion beam from extraction to final energy. The final energy is determined by the extraction voltage and the acceleration and/or deceleration voltage as described below. The second function is to ensure that all beams, independent of beam current and energy, have similar optics as they enter the mass analyzer 50. The focus voltage applied to electrode 104 controls beam optics. Generally, a more negative focus voltage with respect to terminal 74 produces a less divergent beam and a virtual object point that is farther from mass analyzer 50. Conversely, a less negative focus voltage produces a more divergent beam and a virtual object point that is closer to mass analyzer 50. The focus voltage has no effect on the final energy of the beam leaving acceleration/deceleration column 44.

The laws that govern the physics of ion beam extraction from an ion source make it difficult to extract large quantities of usable beam currents at low extraction voltages. For example, the usable beam current extracted with 5 KV extraction voltage is substantially less than at 40 KV extraction voltage. In order to overcome this limitation, the ion beam generator of the present invention is configured to permit the acceleration/deceleration column 44 to either accelerate or decelerate the ion beam, thereby allowing a sufficiently high extraction voltage to be used, independent of the final energy required on the target. Preferably, the extraction voltage is in a range of about 20 KV to 80 KV and is typically about 40 KV, which enables sufficient quantities of useful beam current to be extracted at all energies. Higher or lower extraction voltages may be utilized within the scope of the present invention.

Figure 3:
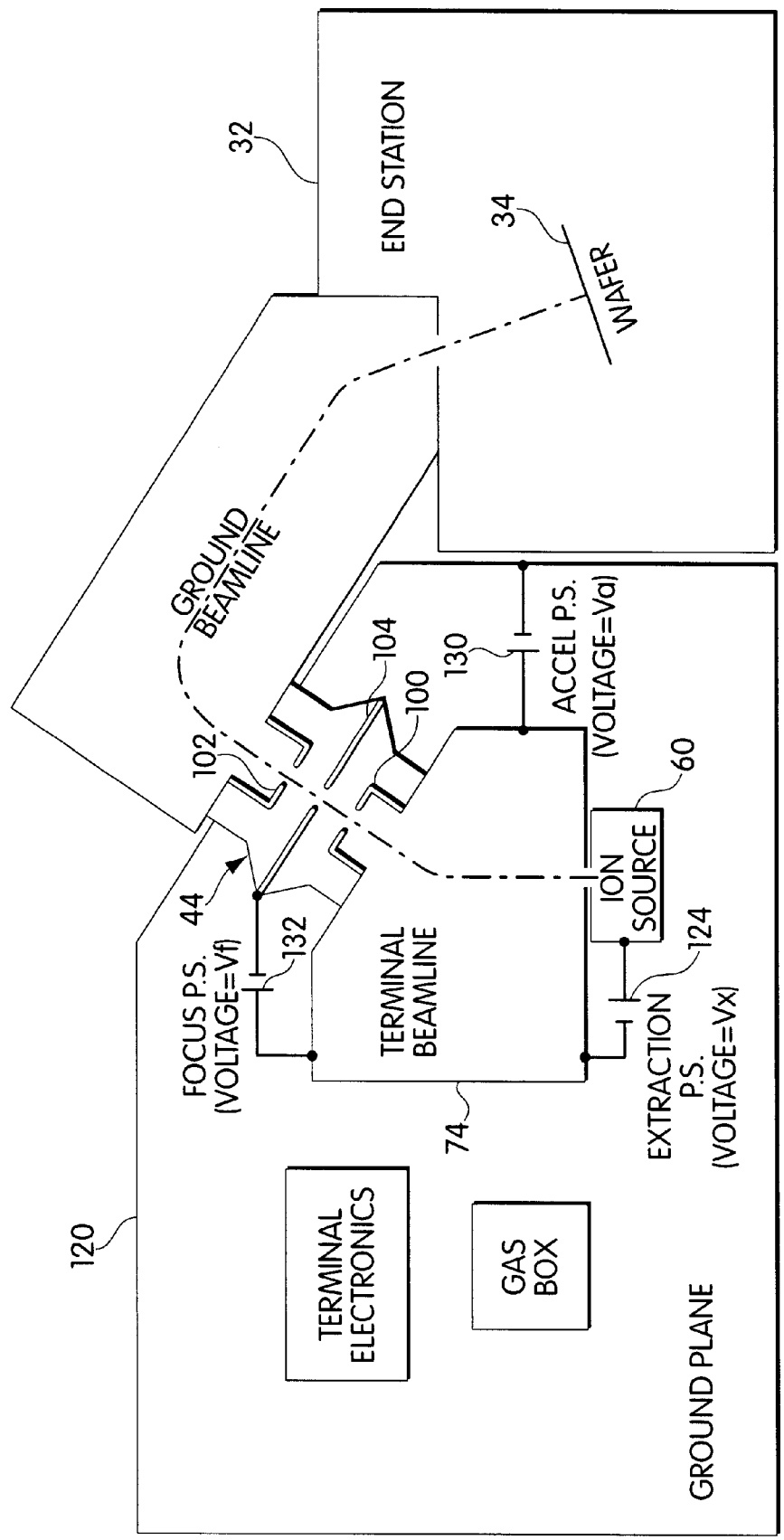
FIG. 3 is a block diagram of the ion implanter, illustrating a configuration for beam acceleration.

A configuration for operating the ion beam generator 10 in an acceleration mode is shown in FIG. 3. Like elements in FIGS. 1–3 have the same reference numerals. Ground electrode 102 of acceleration/deceleration column 44 is connected to a ground plane 120. Terminal 74, including extraction electrode 62 (FIG. 2), is at a terminal potential. An extraction power supply 124 is connected between terminal 74 and ion source 60, so as to bias terminal 74 and extraction electrode 62 at a negative voltage Vx with respect to ion source 60. An acceleration power supply 130 is connected between terminal 74 and ground plane 120 so as to bias terminal 74 at a positive voltage Va with respect to ground. A focus power supply 132 is connected between terminal 74 and focus electrode 104 so as to bias focus electrode 104 at a negative voltage Vf with respect to terminal 74.

The wafer 34 is at ground potential. Therefore the implant energy for singly charged ions is given by the potential of ion source 60 which is the acceleration voltage plus the extraction voltage (Va+Vx). The energy of the beam in the terminal is Vx electron volts. As the beam passes through acceleration/deceleration column 44, it gains Va electron volts. The focus voltage Vf affects the focusing of the beam by changing its energy in the center of column 44 only. The focus voltage has no impact on the final energy.

Figure 4:
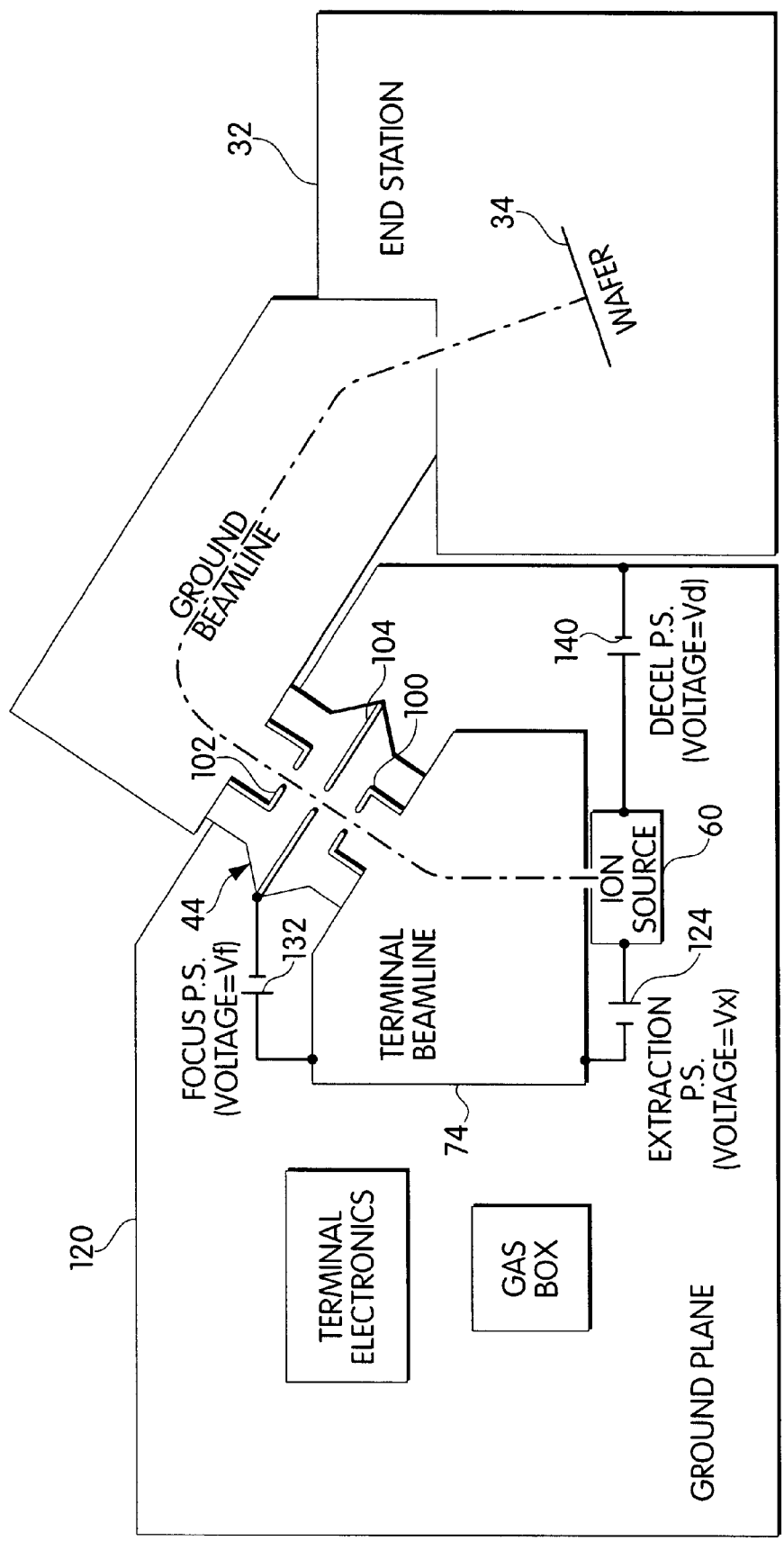
FIG. 4 is a block diagram of the ion implanter, illustrating a configuration for beam deceleration following extraction from the ion source.

A configuration for operating the ion beam generator 10 in a deceleration mode is shown in FIG. 4. Like elements in FIGS. 1–4 have the same reference numerals. Extraction power supply 124 and focus power supply 132 are connected in the same manner described above in connection with FIG. 3. A deceleration power supply 140 is connected between ion source 60 and ground plane 120, so that ion source 60 is biased at a positive voltage Vd with respect to ground plane. Thus, the potential of ion source 60 is the deceleration voltage Vd. The extraction supply 124 biases terminal 74 negatively with respect to ion source 60 and at a potential of Vd−Vx with respect to ground. The energy of the beam in the terminal 74 is Vx electron volts, the same as in the acceleration mode case. However, as the beam passes through acceleration/deceleration column 44, it loses Vx−Vd electron volts to give a final implant energy of Vd electron volts.

Referring again to FIG. 2, the mass analyzer 50 includes a dipole analyzing magnet 160 and a mask 162 having a resolving aperture 163. The dipole magnet 160 deflects desired ions in the ion beam by 90°, so that beam 12 passes through the resolving aperture 163. Undesired particles are deflected by angles other than 90° and are intercepted by mask 162. The mass analyzer 50, which follows acceleration/deceleration column 44, is at ground potential. Dipole magnet 160 brings the beam at final energy to a focus at resolving aperture 163. In a preferred embodiment, the mask 162 may comprise rotating mass slits as disclosed in U.S. Pat. No. 5,629,528 issued May 13, 1997 to Jost et al. The mass analyzer 50 preferably has a resolving power, as defined above, in a range of about 80 to 250 and in a preferred embodiment has a resolving power of about 170. With a resolving power of 170, the mass analyzer 50 rejects ions with a normalized rigidity greater than 1.006 or less than 0.994.

Examples of operation of the ion beam generator of FIG. 2 are now given. In a first example, boron is implanted in semiconductor wafer 34 using $BF_3$ as the source gas. The desired ion is $^{11}B+$. The other principal ions produced by the source, with their normalized rigidities after extraction, are given in Table 1 below.

TABLE 1

| Source Filter Analysis | $^{10}B^+$ | $^{11}B^+$ | $^{19}F^+$ | $^{10}BF^+$ | $^{10}BF^+$ | $^{10}BF_2$ | $^{10}BF_2^+$ |
|---|---|---|---|---|---|---|---|
| Ionic mass (AMU) | 10 | 11 | 19 | 29 | 30 | 48 | 49 |
| Normalized Rigidity | 0.953 | 1 | 1.314 | 1.624 | 1.651 | 2.089 | 2.111 |
| Transmitted | Y | Y | N | N | N | N | N |

It may be observed that only the required $^{11}B^+$ and its isotope $^{10}B^+$ fulfill the source filter transmission condition $0.75>B_{norm}<1.25$. All of the other ions are rejected. This example is illustrated in FIGS. 5 and 6.

Figure 5:
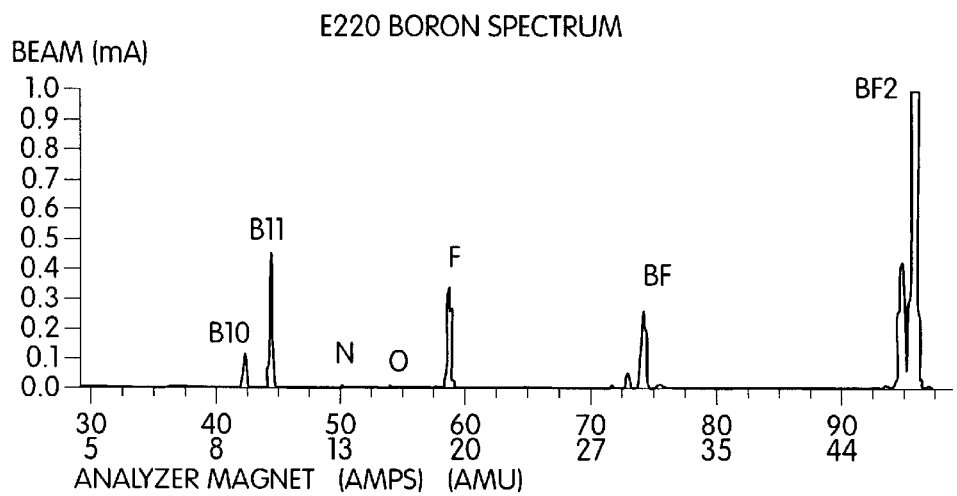
FIG. 5 is a graph of beam current as a function of analyzer magnet current, illustrating species present in a prior art boron ion beam.

FIG. 5 shows constituents of the beam entering the mass analyzer in a prior art ion implanter not having a source filter. The constituents of the beam are identified by plotting the transmitted beam current as a function of magnet coil current as the latter is varied. In the prior art configuration, the two boron isotopes and all of their fluoride derivatives are present in the input beam to the mass analyzer.

Figure 6:
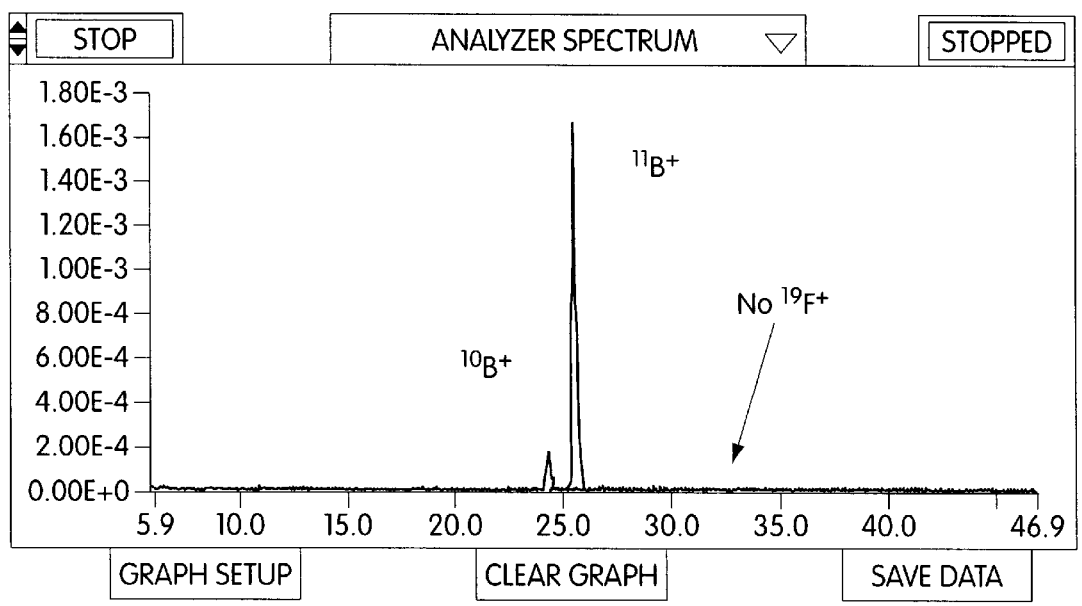
FIG. 6 is a graph of ion beam current as a function of analyzer magnet current, illustrating species present in a boron ion beam in accordance with the invention.

FIG. 6 shows the constituents of the beam in the ion beam generator of FIG. 2. The source filter 42 has removed all but the boron isotopes $^{11}B^+$ and $^{10}B^+$ from the $BF_3$ source beam. This is done prior to acceleration by the acceleration/deceleration column 44.

Except for the required $^{11}B^+$ ions, only $^{10}B^+$ ions are accelerated to final energy by column 44. The mass analyzer 50 then prevents $^{10}B^+$ ions from being transmitted through resolving aperture 163. The normalized rigidity of $^{10}B^+$ ions is 0.953, which is too low for transmission through mass analyzer 50. Since only $^{10}B^+$ ions are removed at final energy, there is a substantially reduced risk of sputter and particle contamination. All of the other source products are removed by the source filter 42 at low energy and remotely from wafer 34, before the beam even leaves the source enclosure.

A second example relates to implanting $P^{++}$ ions using $PH_3$ as the source feed gas. The desired ion is $^{31}P^{++}$. The other principal ions produced by the source and their nor malized rigidities are shown in Table 2 below. It is assumed that the extraction voltage is 70 KV.

TABLE 2

| At Source Filter | $P^{+++}$ | $P^{++}$ | $P^+$ | $P_2^+$ | $P^+$(from dissociated $P_2^+$) |
|---|---|---|---|---|---|
| Ionic mass (AMU) | 31 | 31 | 31 | 62 | 31 |
| Charge State (n) | 3 | 2 | 1 | 1 | 1 |
| Energy (keV) | 210 | 140 | 70 | 70 | 35 |
| Normalized Rigidity | 0.816 | 1 | 1.414 | 2.000 | 1.000 |
| Transmitted | Y | Y | N | N | Y |

The final column in Table 2 comes from molecular $P_2^+$, which can break up after extraction to form $P_0$ and $P^+$, both of which acquire about half of the original molecule's energy.

Following the source filter 42, the beam is accelerated by the column 44. If, for example, the acceleration voltage is 150 KV, then the rigidities of those ions that were not is rejected by the source filter 42 would be as shown in Table 3 below.

TABLE 3

| At Analyzer | $P^{+++}$ | $P^{++}$ | $P^+$(from dissociated $P_2^+$) |
|---|---|---|---|
| Ionic mass (AMU) | 31 | 31 | 31 |
| Charge State (n) | 3 | 2 | 1 |
| Energy (keV) | 660 | 440 | 185 |
| Normalized Rigidity | 0.816 | 1 | 1.30 |
| Transmitted | N | Y | N |

Only the required $P^{++}$ ions meet the rigidity transmission requirement of mass analyzer 50 and are transmitted to the wafer.

To summarize, the source filter 42 removes dimer ions that haven't broken up before reaching it, and mass analyzer 50 removes those ions that did break up before reaching the source filter 42. It is the action of the acceleration system that allows the mass analyzer 50 to distinguish the early breakup dimer ions from the required beam. Without both pre and post acceleration analysis, dimer breakup contaminants would not be removed by magnetic analysis.

Figure 7:
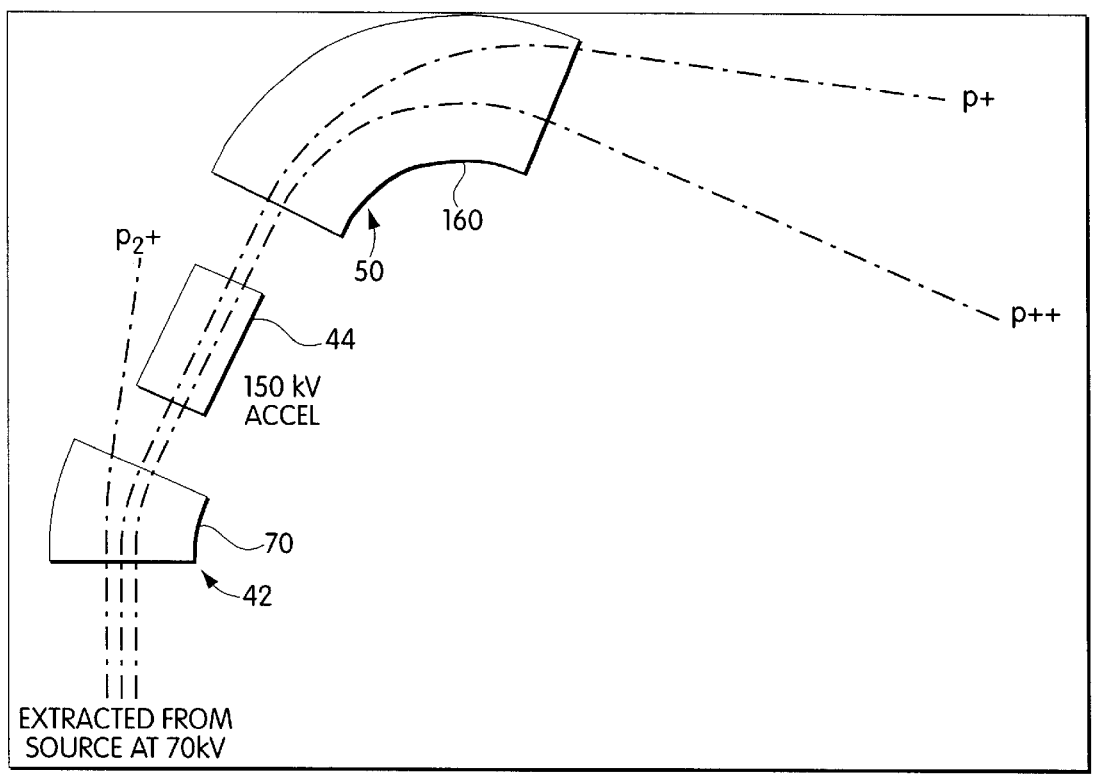
FIG. 7 is a schematic diagram of the ion beam generator, illustrating generation of doubly charged phosphorous ions with the ion beam generator of FIG. 2.

The combined action of the source filter 42, the acceleration/deceleration column 44 and mass analyzer 50 in removing all of the contaminants for this example is illustrated in the simplified schematic diagram of FIG. 7. The dimer ion $P_2^+$ that has not dissociated is removed by the source filter 42 before acceleration. The $P^+$product of the $P_2^+$ ion breakup is removed by mass analyzer 50 after acceleration. If the source filter 42 was not utilized, then $P_2^+$ ions would still be present in the beam after acceleration and could break up before analysis and be transmitted to the wafer.

Figure 8:
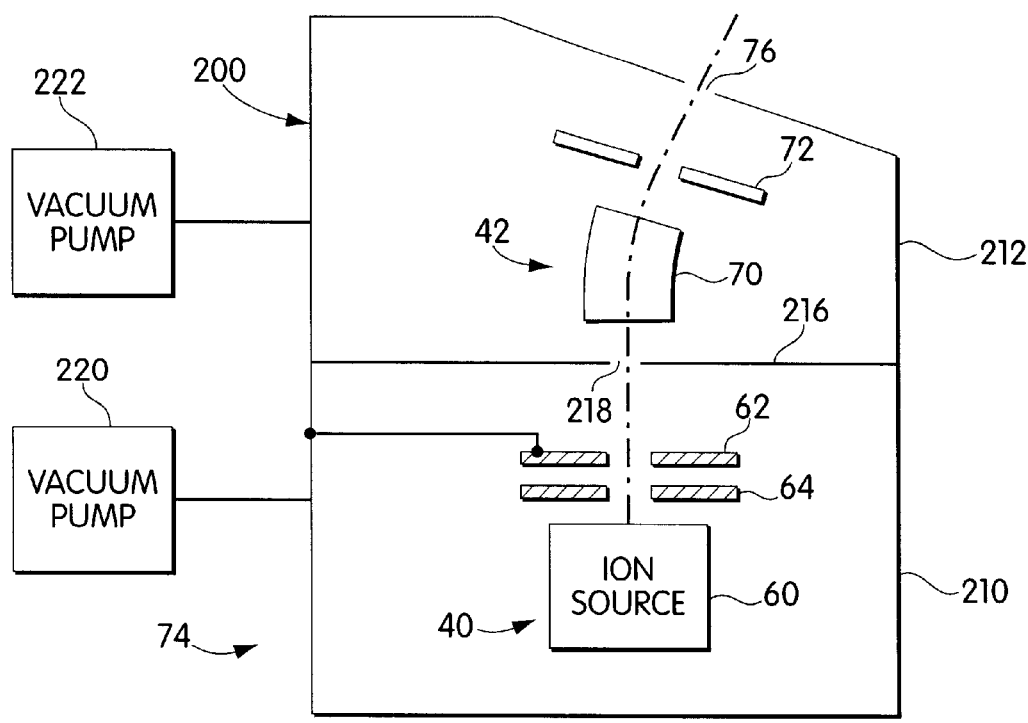
FIG. 8 is a block diagram of the ion beam source and the source filter, illustrating a differential vacuum pumping configuration.

A block diagram of a suitable configuration for terminal 74 is shown in FIG. 8. Terminal 74 includes a source enclosure 200 that is electrically connected to extraction electrode 62. The pressure in the region of ion beam source 40 is relatively high due to byproducts of the ion generation process. It is desirable to prevent the gas generated in the region of ion beam source 40 from migrating downstream in the beam direction toward wafer 34. In a preferred configuration, source enclosure 200 includes a first compartment 210 containing ion beam source 40 and a second compartment 212 containing source filter 42. The compartments 210 and 212 are separated by a wall 216 having a opening 218, which may be on the order of about 20 millimeters in diameter, for passing the ion beam from ion beam source 40 to source filter 42. The ion beam exits from compartment 212 through aperture 76. The first compartment 210 is connected by a suitable conduit to a vacuum pump 220, and second compartment 212 is connected by a suitable conduit to a vacuum pump 222. The configuration of FIG. 8 provides differential vacuum pumping of compartments 210 and 212 so that the pressure in compartment 212 is lower than the pressure in compartment 210, and the quantity of gas that escapes through aperture 76 is relatively low.

While there have been shown and described what are at present considered the preferred embodiments of the present invention, it will be obvious to those skilled in the art that various changes and modifications may be made therein without departing from the scope of the invention as defined by the appended claims.

What is claimed is:

1. An ion beam generator comprising:
    an ion beam source for generating an ion beam;
    an acceleration/deceleration column for selectably accelerating or decelerating ions in said ion beam to desired energies;
    a relatively low resolution source filter positioned between said ion beam source and said acceleration/deceleration column;
    a relatively high resolution mass resolution mass analyzer positioned downstream of said acceleration/deceleration column; and
    a scanning assembly for deflecting said ion beam to form a scanned ion beam.

2. An ion beam generator as defined in claim 1 further comprising a source enclosure, wherein said ion beam source and said source filter are located in said source enclosure.

3. An ion beam generator as defined in claim 2 wherein said source enclosure comprises a first compartment containing said ion beam source and a second compartment containing said source filter, and a passage interconnecting said first and second compartments.

4. An ion beam generator as defined in claim 3 further comprising a first vacuum pump coupled to said first compartment and a second vacuum pump coupled to said second compartment, wherein said first and second compartments are differentially vacuum pumped.

5. An ion beam generator as defined in claim 1 wherein said acceleration/deceleration column comprises a terminal electrode, a ground electrode and a focus electrode positioned between said terminal electrode and said ground electrode for focusing said ion beam.

6. An ion beam generator as defined in claim 1 wherein said acceleration/deceleration column comprises a focus electrode for focusing said ion beam and a focus power supply coupled to said focus electrode.

7. An ion beam generator as defined in claim 1 wherein said source filter comprises a first dipole magnet for deflecting a desired ion species by about 25° and a first resolving aperture for passing said desired ion species.

8. An ion beam generator as defined in claim 7 wherein said mass analyzer comprises a second dipole magnet for deflecting said desired ion species by about 90° and a second resolving aperture for passing said desired ion species.

9. An ion beam generator as defined in claim 1 wherein said source filter has a resolving power of about 2 to 10 and said mass analyzer has a resolving power of about 80 to 250.

10. An ion implanter comprising:
    an ion beam generator for generating a beam of energetic ions, said ion beam generator comprising:
        an ion beam source for generating an ion beam;
        an acceleration/deceleration column for selectably accelerating or decelerating ions in said ion beam to desired energies;
        a relatively low resolution source filter positioned between said ion beam source and said acceleration/deceleration column; and
        a relatively high resolution mass analyzer positioned downstream of said acceleration/deceleration column;
    a scanning assembly for deflecting said beam of energetic ions to form a scanned ion beam; and
    an end station for supporting a semiconductor wafer in the path of said scanned ion beam, wherein ions in said scanned ion beam are implanted into said semiconductor wafer.

11. An ion beam generator comprising:
    an ion beam source for generating an ion beam;
    a deceleration column for decelerating ions in said ion beam to desired energies;
    a source filter positioned between said ion beam source and said deceleration column for removing first undesired species from said ion beam; and
    a mass resolution mass analyzer positioned downstream of said deceleration column for removing second undesired species from said ion beam.

12. An ion beam generator as defined in claim 11 wherein said ion beam source comprises an ion source for generating ions and an extraction electrode for extracting said ions from said ion source to form said ion beam.

13. An ion beam generator as defined in claim 12 further comprising an extraction power supply coupled between said ion source and said extraction electrode for biasing said extraction electrode negatively with respect to said ion source and a deceleration power supply coupled between said ion source and ground for biasing said ion source positively with respect to ground.

14. An ion beam generator comprising:
    an ion beam source for generating an ion beam;
    an acceleration column for accelerating ions in said ion beam to desired energies;
    a source filter positioned between said ion beam source and said acceleration column for removing first undesired species from said ion beam; and
    a mass resolution mass analyzer positioned downstream of said acceleration column for removing second undesired species from said ion beam.

15. An ion beam generator as defined in claim 14 wherein said ion beam source comprises an ion source for generating ions and an extraction electrode for extracting said ions from said ion source to form said ion beam.

16. An ion beam generator as defined in claim 15 further comprising an extraction power supply coupled between said ion source and said extraction electrode for biasing said extraction electrode negatively with respect to said ion source and an acceleration power supply coupled between said extraction electrode and ground for biasing said extraction electrode positively with respect to ground.

* * * * *